(12) United States Patent
Kobayashi et al.

(10) Patent No.: US 11,923,270 B2
(45) Date of Patent: Mar. 5, 2024

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Tatsuya Kobayashi, Yokohama Kanagawa (JP); Fumiyoshi Kawashiro, Chiyoda Tokyo (JP); Hisashi Tomita, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 85 days.

(21) Appl. No.: 17/465,703

(22) Filed: Sep. 2, 2021

(65) Prior Publication Data
US 2022/0093485 A1 Mar. 24, 2022

(30) Foreign Application Priority Data
Sep. 24, 2020 (JP) ................................. 2020-159922

(51) Int. Cl.
| | |
|---|---|
| *H01L 23/373* | (2006.01) |
| *H01L 21/48* | (2006.01) |
| *H01L 23/00* | (2006.01) |
| *H01L 25/00* | (2006.01) |
| *H01L 25/07* | (2006.01) |

(52) U.S. Cl.
CPC ...... *H01L 23/3735* (2013.01); *H01L 21/4807* (2013.01); *H01L 24/29* (2013.01); *H01L 24/32* (2013.01); *H01L 24/40* (2013.01); *H01L 24/48* (2013.01); *H01L 24/73* (2013.01); *H01L 24/83* (2013.01); *H01L 25/072* (2013.01); *H01L 25/50* (2013.01); *H01L 2224/29239* (2013.01); *H01L 2224/29247* (2013.01); *H01L 2224/29255* (2013.01); *H01L 2224/32225* (2013.01); *H01L 2224/40225* (2013.01); *H01L 2224/48225* (2013.01); *H01L 2224/73263* (2013.01); *H01L 2224/73265* (2013.01); *H01L 2224/8384* (2013.01)

(58) Field of Classification Search
None
See application file for complete search history.

(56) References Cited

U.S. PATENT DOCUMENTS

| | | | |
|---|---|---|---|
| 10,546,800 B2 | 1/2020 | Hino et al. | |
| 2006/0022326 A1* | 2/2006 | Morita | H01L 24/33 |
| | | | 257/E23.03 |

(Continued)

FOREIGN PATENT DOCUMENTS

| | | |
|---|---|---|
| JP | 2012-099779 A | 5/2012 |
| JP | 5837697 B2 | 12/2015 |

(Continued)

*Primary Examiner* — Michelle Mandala
*Assistant Examiner* — Jordan M Klein
(74) *Attorney, Agent, or Firm* — Knobbe Martens Olson & Bear LLP (57) ABSTRACT

According to one embodiment, a semiconductor device includes a semiconductor chip having a first electrode on a first surface, a metal plate, and a first conductive bonding sheet that is disposed between the first surface of the semiconductor chip and the metal plate and bonds the first electrode to the metal plate.

6 Claims, 4 Drawing Sheets

(56) References Cited

U.S. PATENT DOCUMENTS

| | | | |
|---|---|---|---|
| 2008/0160183 A1* | 7/2008 | Ide | H01L 24/29 252/500 |
| 2008/0173398 A1* | 7/2008 | Yasuda | H01L 24/29 156/326 |
| 2008/0237851 A1* | 10/2008 | Morita | H01L 24/40 257/737 |
| 2012/0106109 A1 | 5/2012 | Kim et al. | |
| 2014/0225247 A1 | 8/2014 | Becker et al. | |
| 2014/0230989 A1 | 8/2014 | Becker et al. | |
| 2017/0117209 A1 | 4/2017 | Benedikt et al. | |
| 2018/0342478 A1* | 11/2018 | Nakako | H01L 24/83 |
| 2022/0148946 A1* | 5/2022 | Umeda | H01L 24/40 |

FOREIGN PATENT DOCUMENTS

| | | |
|---|---|---|
| JP | 5955392 B2 | 7/2016 |
| JP | 2017-117869 A | 6/2017 |
| JP | 2018-98219 A | 6/2018 |
| JP | 2018-110149 A | 7/2018 |
| JP | 6445584 B2 | 12/2018 |
| JP | 2019-079905 A | 5/2019 |
| JP | 2019-83283 A | 5/2019 |

\* cited by examiner

SEMICONDUCTOR DEVICE

INCORPORATION BY REFERENCE TO RELATED APPLICATION

This application is based upon and claims the benefit of priority from. Japanese Patent Application No. 2020-159922, filed Sep. 24, 2020, the entire contents of which are incorporated herein by reference. Any and all applications for which a foreign or domestic priority claim is identified in the Application Data Sheet as filed with the present application are hereby incorporated by reference under 37 CFR 1.57.

FIELD

Embodiments described herein relate generally to a semiconductor device.

BACKGROUND

Due to an increase in current flowing through a semiconductor module, an increase in allowable current amount of a wiring that connects semiconductor chips is required.

Examples of related art include Japanese Patent No. 6445584.

DETAILED DESCRIPTION

Embodiments provide a semiconductor device having high reliability.

In general, according to one embodiment, a semiconductor device including a semiconductor chip having a first electrode on a first surface, a metal plate, and a first conductive bonding sheet that is disposed between the first surface of the semiconductor chip and the metal plate and bonds the first electrode to the metal plate is provided.

Hereinafter, an embodiment of the present disclosure will be described with reference to the drawings. In the drawings appended hereto, scales, horizontal and vertical dimension ratios, and the like are appropriately modified to be exaggerated from those of actual ones for convenience of illustration and easy understanding.

Hereinafter, embodiments will be described with reference to the drawings. In the drawings, the same or similar parts are denoted by the same or similar reference symbols.

Herein, the same or similar members are denoted by the same reference symbols, and duplicated description may be omitted.

To indicate a positional relationship of parts herein, an upward direction in the drawings is described as "upper", and a downward direction in the drawings is described as "lower". Herein, the concepts of "upper" and "lower" are not necessarily a term representing a relationship of gravity direction.

The terms such as "parallel", "orthogonal", and "the same", values of length and angle, and the like, which define shape, geometrical condition, and the degree of the shape and the geometrical condition, used herein, are not limited to their strict definitions, and are interpreted to include a range where a similar function can be expected.

First Embodiment

Figure 1:
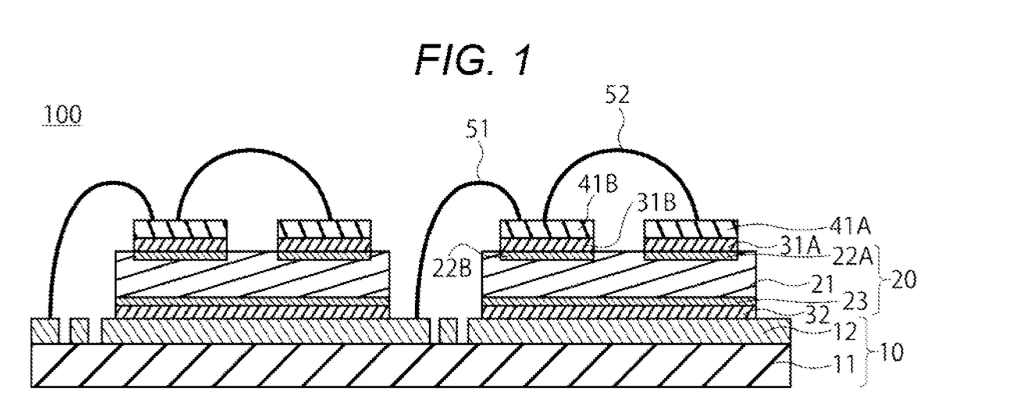
FIG. 1 is a cross-sectional view of a semiconductor device of an embodiment.

A first embodiment relates to a semiconductor device. The first embodiment more particularly relates to a power semiconductor module. FIG. 1 is a cross-sectional view of a semiconductor device 100 of the embodiment. The cross-sectional view of the semiconductor device 100 in FIG. 1 represents a main part of the semiconductor device 100.

The semiconductor device 100 in FIG. 1 has a substrate 10, a semiconductor chip 20, a first conductive bonding sheet 31, a second conductive bonding sheet 32, a first metal plate 41 (e.g., a layer of metal), and wirings 51 and 52. In FIG. 1, two semiconductor chips 20 are mounted on the substrate 10.

The substrate 10 has an insulating support 11 and a metal film 12. For example, the substrate 10 is a printed board. For example, the support 11 is a resin, or a ceramic such as SiN, AlN, and $Al_2O_3$. The metal film 12 is a wiring layer of the substrate 10. A metal film may be also provided on a side opposite to a side of the metal film 12 of the support 11. The metal film 12 contains one or more kinds of metals selected from the group consisting of Au, Ag, Cu, Ni, Pd, and Pt. The thickness of the metal film 12 is typically 100 μm or more and 1,000 μm or less. The metal film 12 is bonded to a second electrode 23 of the semiconductor chip 20 via the second conductive bonding sheet 32.

The semiconductor chip 20 has a semiconductor element 21, and a first electrode 22 and the second electrode 23 that are provided on surfaces of the semiconductor element 21. In FIG. 1, the number of semiconductor chip 20 provided on the substrate 10 is two. The semiconductor device 100 includes 10 or more semiconductor chips 20, which are not illustrated. The semiconductor chips 20 are electrically connected. More specifically, the semiconductor element 21 is a power semiconductor element such as an insulated gate biopolar transistor (IGBT), MOSFET, a schottky barrier diode, and a PIN diode. FIG. 1 represents an electrode that is a part of the semiconductor chip 20. A first electrode 22A and a first electrode 22B are provided on or at a first surface (e.g., an upper side) of the semiconductor element 21. The second electrode 23 is provided on or at a second surface (e.g., a lower side) of the semiconductor element 21 opposite the first surface. For example, the first electrode 22 is an emitter electrode, a source electrode, or an anode electrode. For example, the second electrode 23 is a collector electrode, a drain electrode, or a cathode electrode. It is preferable that the first electrode 22 and the second electrode 23 further contain one or more kinds of metals selected from the group consisting of Au, Ag, Cu, Ni, Pd, and Pt in addition to Al. It is preferable that surfaces of the first electrode 22 and the second electrode 23 be plated with Ni/Au, Ni/Ag, Ni/Cu, Ni/Pd, or the like. The semiconductor device may have a flip chip structure, and a configuration of upper and lower electrodes may be reversed.

The first conductive bonding sheet 31 and the second conductive bonding sheet 32 are a conductive sheet for bonding members. The first conductive bonding sheet 31 is provided between the electrode 22 (22A and 22B) of each of the semiconductor chip 20 and the first metal plate 41 (41A and 41B). The second conductive bonding sheet 32 is provided between the electrode 23 of the semiconductor chip 20 and the metal film 12. Hereinafter, the first conductive bonding sheet 31 and the second conductive bonding sheet 32 may be comprehensively abbreviated as conductive bonding sheet.

The conductive bonding sheet contains Ag particles. The conductive bonding sheet may contain a trace of organic substance such as resin. For example, the conductive bonding sheet contains one or more kinds of metal particles selected from the group consisting of Ag particles having a primary particle diameter of 10 nm or more and 5 μmar less, Cu particles having a primary particle diameter of 10 nm or more and 5 μm or less, and Ni particles having a primary particle diameter of 10 nm or more and 5 μm or less. The conductive bonding sheet is obtained by pressurizing and heating a sheet-shaped conductive die attach bonding material containing metal particles having a primary particle diameter of 1 nm or more and 500 nm or less, resulting in sintering. The thickness of the conductive bonding sheet is preferably 10 μm or more and 200 μm or less, and more preferably 20 μm or more and 50 μm or less. The conductive bonding sheet may have a gap in which a circumscribed circle diameter is 10 nm or more and 2 μm or less in the inside thereof. The sheet-shaped conductive die attach bonding material contains Ag particles, a low boiling point binder, a thermally decomposing acrylic resin, a polycarbonate resin, and the like. An organic substance contained in the sheet-shaped conductive die attach bonding material and a decomposed substance thereof may partially remain in the conductive bonding sheet.

In the embodiment, the sheet-shaped conductive die attach bonding material is pressurized and heated without a conductive paste that is applied or printed, resulting in sintering and bonding. When a conductive paste is used, shifting occurs during application or printing, and the conductive paste may protrude to a side face of the semiconductor chip 20 during pressurization, and creep on the side face of the semiconductor chip 20. When shifting occurs during application or printing, conductance and reliability are deteriorated due to a decrease in bonding area. By shifting, protrusion from as space between bonding members may be increased. When the protrusion caused by shifting is small, an influence is small. However, when the protrusion caused by shifting is large, short circuit or poor dielectric strength voltage may be caused by creep, or a protruded part may be released to cause short circuit. According to bonding through the conductive bonding sheet, deformation hardly occurs under pressurization. Therefore, the possibility of short circuit by such shifting and creep is extremely low. Due to a sheet shape of the sheet-shaped conductive die attach bonding material, it is possible to transfer the sheet-shaped conductive die attach bonding material to a member to be bonded to an electrode plane or the semiconductor chip 20. Thus, connection between members through the conductive bonding sheet can be achieved according to a position and a shape for the electrode plane.

Figure 2:
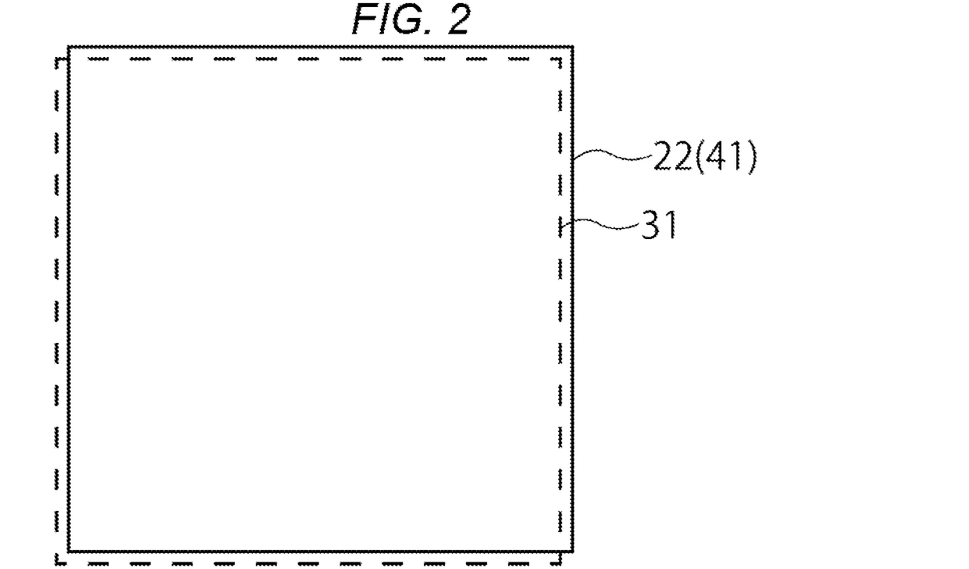
FIG. 2 is a view illustrating connection through a conductive bonding sheet of the embodiment.
Figure 3:
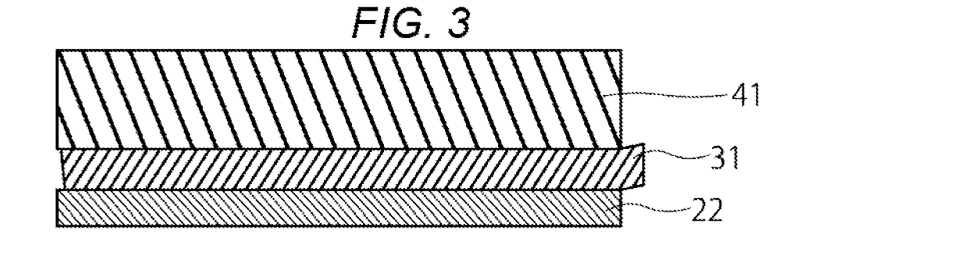
FIG. 3 is a view illustrating connection through the conductive bonding sheet of the embodiment.

FIGS. 2 and 3 are a view illustrating connection through the conductive bonding sheet. In FIGS. 2 and 3, the first conductive bonding sheet 31 is illustrated, but the same is applied to the second conductive bonding sheet 32. In FIG. 2, the position and size of the first conductive bonding sheet 31 between the first electrode 22 and the first metal plate 41 are illustrated. FIG. 3 is a partial cross-sectional view of the first conductive bonding sheet 31 between the first electrode 22 and the first metal plate 41. In FIG. 3, the position and cross-sectional shape of the first conductive bonding sheet 31 are illustrated. A rectangular shape represented by a solid line in FIG. 2 represents an outer periphery of the first electrode 22 and the first metal plate 41. A rectangular shape represented by a dashed line represents an outer periphery of the first conductive bonding sheet 31. The first conductive bonding sheet 31 is obtained by transferring the sheet-shaped conductive die attach bonding material to the metal plate 41 or the first electrode 22, and heating the sheet-shaped conductive die attach bonding material under pressurization. Therefore, the electrode 22 is unlikely to be shifted in position and shape with stability. When a paste is used, it is difficult to preciously adjust the bonding area due to high viscosity of the paste. In order to prevent protrusion after sintering of a conductive paste, the paste is applied at an area that is smaller than the bonding area. Alternatively, in order to achieve appropriate bonding to a whole surface, the paste is applied at an area that is larger than the bonding area. Thus, stable bonding is achieved. When the sheet-shaped conductive die attach bonding material is used, transfer is possible. Therefore, shifting in position or a difference in size can be decreased. According to the sheet-shaped conductive die attach bonding material, deformation caused under pressurization is small, and therefore protrusion and creep are unlikely to occur. As illustrated in FIG. 3, a protruded part is unlikely to creep along the side face of the semiconductor chip 20. The maximum value of a distance when the outer periphery of the first electrode 22 of the semiconductor chip 20 is overlapped with the outer periphery of the first conductive bonding sheet 31 in a direction from the semiconductor chip 20 to the first metal plate 41 is preferably 0.1 mm or less. The average value of the distance when the outer periphery of the first electrode 22 of the semiconductor chip 20 is overlapped with the outer periphery of the first conductive bonding sheet 31 in the direction from the semiconductor chip 20 to the first metal plate 41 is preferably 0.1 mm or less. It is preferable that the distance when the outer periphery of the first electrode 21 of the semiconductor chip 20 is overlapped with the outer periphery of the first conductive bonding sheet 31 in the direction from the semiconductor chip 20 to the first metal plate 41 be measured along the outer periphery of the first electrode 22 at 1-mm intervals.

As illustrated in FIG. 3, the cross-sectional shape of the first conductive bonding sheet 31 is a trapezoid. When the first conductive bonding sheet 31 does not protrude, the cross-sectional shape of the first conductive bonding sheet is a trapezoid as a whole. Specifically, the first conductive bonding sheet 31 has a quadrangular truncated pyramidal shape (a polygonal pyramidal shape when the semiconductor chip 20 has a polygonal shape other than quadrangle), a face on the first metal plate 41 side is a bottom face, and a face on the semiconductor chip 20 side is an upper face. The shape of the truncated pyramid in the embodiment includes not only a strict shape but also a tapering shape where the size of the upper face is different from the size of the bottom face. When the shape of the first conductive bonding sheet 31 after sintering is a trapezoid, good bonding and a decrease in probability of short circuit due to creep or the like are achieved. A face facing the upper face side of the first conductive bonding sheet 31 that has a truncated pyramidal shape and a face facing the bottom face side are exchanged according to a transfer condition. When the difference in area between the upper face and the bottom face of the first conductive bonding sheet 31 that has a truncated pyramidal shape is large, the ratio of non-bonding plane is high. The area of the upper face of the first conductive bonding sheet 31 that has a truncated pyramidal shape is preferably 90% or more and 99% or less, and more preferably 95% or more and 99% or less of the area of the bottom face of the first conductive bonding sheet 31 that has a truncated pyramidal shape. The aforementioned areas may be determined from the length of the upper face and the length of the bottom face in the cross section.

The protruded part is a part of the outer periphery of the first conductive bonding sheet 31 that protrudes outside the outer periphery of the first electrode 22, and a non-bonding part is a part of the outer periphery of the first conductive bonding sheet 31 that is located inside the outer periphery of the first electrode 22. When the ratio of the protruded part and the non-bonding part to the area of the first electrode 22 is small, the conductance of the bonding part is high, and the reliability is high. When the outer periphery of the first electrode 22 of the semiconductor chip 20 is overlapped with the outer periphery of the first conductive bonding sheet 31 in the direction from the semiconductor chip 20 to the first metal plate 41, the sum of the area of the part of the outer periphery of the first conductive bonding sheet 31 that protrudes outside the outer periphery of the first electrode 22 and the area of the part of the outer periphery of the first conductive bonding sheet 31 that is located inside the outer periphery of the first electrode 22 is preferably 5% or less, and more preferably 3% or less of the area of the first electrode 22. In other words, the sum of the area of the part of the outer periphery of the first conductive bonding sheet 31 that protrudes outside the outer periphery of the first electrode 22 and the area of the part of the outer periphery of the first conductive bonding sheet 31 that does not overlap with the first electrode 22 is preferably 5% or less, and more preferably 3% or less of the area of the first electrode 22.

The same as in the first conductive bonding sheet 31 is applied to the second conductive bonding sheet 32. The maximum value of a distance when the outer periphery of the second electrode 23 of the semiconductor chip 20 is overlapped with the outer periphery of the second conductive bonding sheet 32 in a direction from the semiconductor chip 20 to the metal film 12 is preferably 0.1 mm or less. The average value of the distance when the outer periphery of the second electrode 23 of the semiconductor chip 20 is overlapped with the outer periphery of the second conductive bonding sheet 32 in the direction from the semiconductor chip 20 to the metal film 12 is preferably 0.1 mm or less. When the outer periphery of the second electrode 23 of the semiconductor chip 20 is overlapped with the outer periphery of the second conductive bonding sheet 32 in the direction from the semiconductor chip 20 to the metal film 12, the sum of the area of the part of the outer periphery of the second conductive bonding sheet 32 that protrudes outside the outer periphery of the second electrode 23 and the area of the part of the outer periphery of the second conductive bonding sheet 32 that is located inside the outer periphery of the second electrode 23 is preferably 5% or less, and more preferably 3% or less of the area of the first electrode 22.

The first metal plates 41A and 41B are connected to the first electrodes 22A and 22B of the semiconductor chip 20 via the first conductive bonding sheet 31. The first metal plates 41A and 41B are connected by the wiring 52. The first metal plates 41A and 41B are electrically connected to the metal film 12 of the substrate 10 by the wiring 51.

For example, the first metal plate 41 is preferably a Cu, Mo, or W plate. The plates may be plated with nickel-gold. The thickness of the first metal plate 41 is typically 30 μm or more and 1 mm or less. It is appropriately selected in consideration of current-carrying capacity, heat dissipation properties, and the like.

The wirings 51 and 52 are used to electrically connect the semiconductor chips 20 or the semiconductor chip 20 to the metal film 12. For the wiring 51, for example, an aluminum clad material such as Al and Al/Cu is used. The wirings 51 and 52 are preferably a conductive body such as a bonding wire, ribbon, and a metal pillar. In FIG. 1, the wirings 51 and 52 that are assumed to be a bonding wire or ribbon are illustrated.

Figure 4:
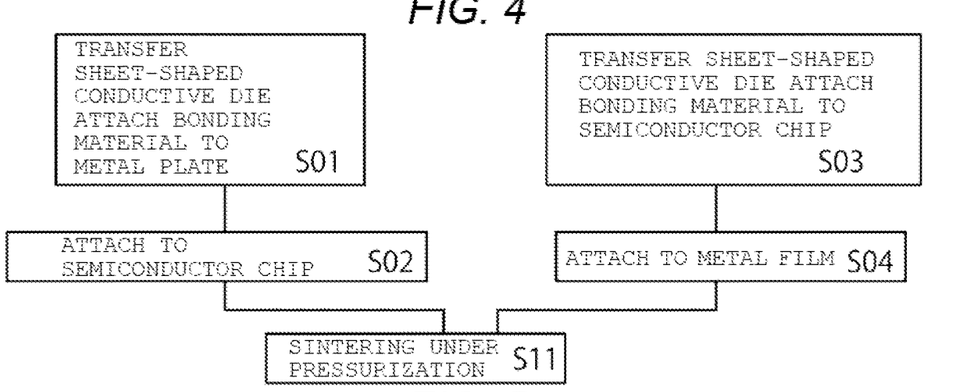
FIG. 4 is a flow chart illustrating a method for manufacturing the semiconductor device of the embodiment.
Figure 5:
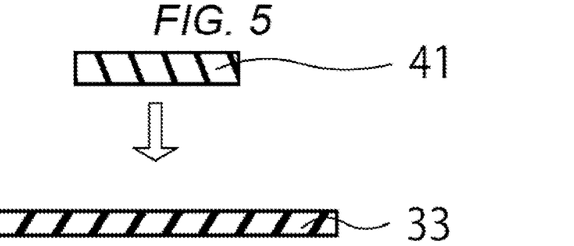
FIG. 5 is a process view of the method for manufacturing the semiconductor device of the embodiment.

FIG. 4 is a flow chart illustrating a method for manufacturing the semiconductor device 100 of the first embodiment. In the flow chart, a certain process in the method for manufacturing the semiconductor device 100 is illustrated. Examples of a method in which the sheet-shaped conductive die attach bonding material is sintered under pressurization and bonding through the conductive bonding sheet is achieved include two methods. A left flow chart in FIG. 4 is involved in bonding of the semiconductor chip 20 to the first metal plate 41. A right flow chart in FIG. 4 is involved in bonding of the semiconductor chip 20 to the metal film 12 of the substrate 10. In FIG. 4, a procedure for sintering under pressurization is illustrated. Sintering may be performed under an atmospheric pressure without pressurization depending on the kind of the sheet-shaped conductive die attach bonding material.

One of the methods includes (S01) transferring the sheet-shaped conductive die attach bonding material to the first metal plate 41, (S02) attaching the first metal sheet 41 having the transferred sheet-shaped conductive die attach bonding material to the semiconductor chip 20, and (S11) applying a pressure to the first metal plate 41 and the semiconductor chip 20, resulting in sintering. When a pressure is applied, resulting in sintering, the first metal plate 41 is bonded to the first electrode 21 of the semiconductor chip 20 by metal particles in the sheet-shaped conductive die attach bonding material.

The other includes (S03) transferring the sheet-shaped conductive die attach bonding material to the semiconductor chip 20, (S04) attaching the semiconductor chip 20 having the transferred sheet-shaped conductive die attach bonding material to the metal film 12 of the substrate 10, and (S11) applying a pressure to the semiconductor chip 20 and the substrate 10, resulting in sintering. When a pressure is applied, resulting in sintering, the metal film 12 of the substrate 10 is bonded to the second electrode 22 of the semiconductor chip 20 by metal particles in the sheet-shaped conductive die attach bonding material.

Hereinafter, the method for manufacturing the semiconductor device 100 will be described using process views of the method for manufacturing the semiconductor device 100 of FIGS. 5 to 10. In the process view of FIG. 5, a procedure of transferring a sheet-shaped conductive die attach bonding material 33 to the first metal plate 41 is illustrated. The sheet-shaped conductive die attach bonding material 33 that has an area larger than the area of the first metal plate 41 is attached, and then transferred according to the shape of the first metal plate 41 by heating and pressurization. In order to control the area of the sheet-shaped conductive die attach bonding material 33 that is transferred to the first metal plate 41, a mask material may be formed on the sheet-shaped conductive die attach bonding material 33, followed by transfer. For subsequent attachment to two first electrodes 22A and 22B on the first surface of the semiconductor chip 20, two parts of members in which sheet-shaped conductive die attach bonding materials 33A and 33B are transferred to the first metal plates 41A and 41B are prepared for each semiconductor chip 20. When the number of the first electrode 22 of the semiconductor chip 20 to which the first metal plate 41 is bonded is one, one part of the member is prepared for each semiconductor chip 20. In this case, the first metal plate 41 that has an opening for a gate wiring is used, if necessary.

Figure 6:
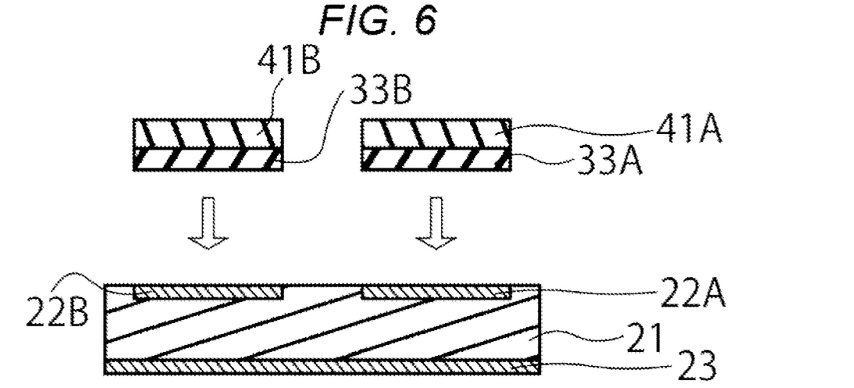
FIG. 6 is a process view of the method for manufacturing the semiconductor device of the embodiment.

In the process view of FIG. 6, the member in which the sheet-shaped conductive die attach bonding materials 33A and 33B are transferred to the first metal plates 41A and 41B are attached to the first electrodes 22A and 22B of the first surface of the semiconductor chip 20, and temporarily fixed.

Figure 7:
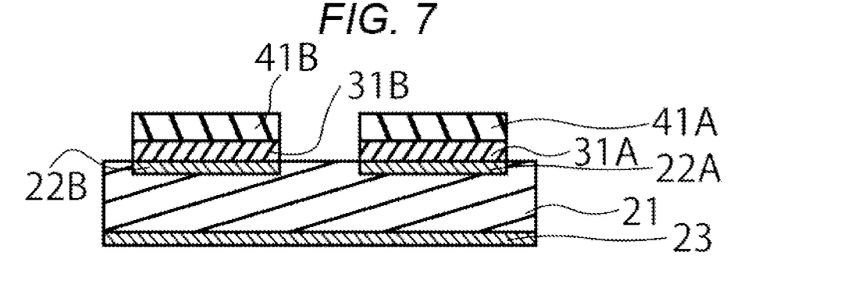
FIG. 7 is a process view of the method for manufacturing the semiconductor device of the embodiment.

In the process view of FIG. 7, the member illustrated in FIG. 6 is sintered, and the first metal plates 41A and 41B are bonded to the semiconductor chip 20. While the metal particles of the first first conductive bonding sheets 31A and 31B are in a state where sintering is not complete, aggregation of the metal particles proceeds under sintering resulting in bonding. By sintering, the sheet-shaped conductive die attach bonding materials 33A and 33B are changed to a conductive bonding sheet for bonding the first metal plates 41A and 41B to the first electrodes 22A and 22B of the semiconductor chip 20. Thus, a member in which the first metal plates 41A and 41B are bonded to the first electrodes 22A and 22B of the semiconductor chip 20 through the first conductive bonding sheets 31A and 31B is obtained. In order to enhance the bonding strength in sintering for bonding the first metal plates 41A and 41B to the semiconductor chip 20, it is preferable that appropriate pressurization be performed.

Figure 8:
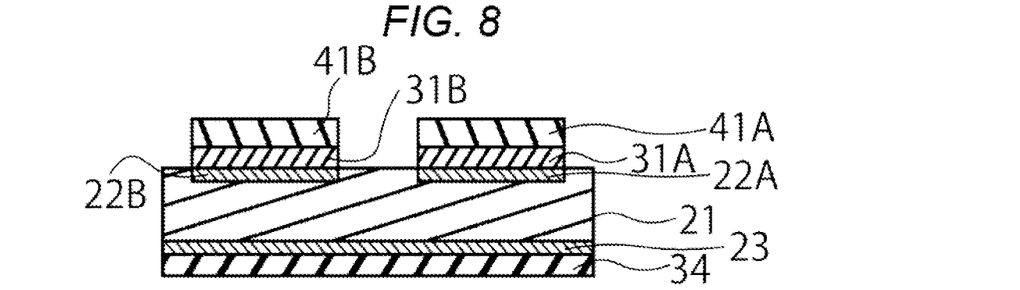
FIG. 8 is a process view of the method for manufacturing the semiconductor device of the embodiment.

In the process view of FIG. 8, a sheet-shaped conductive die attach bonding material 34 is transferred to the second electrode 23 that is provided on a second surface on a side opposite to the first surface of the semiconductor chip 20 in the member in which the first metal plates 41A and 41B are bonded to the first electrodes 22A and 22B of the semiconductor chip 20 through the first conductive bonding sheets 31A and 31B. It is preferable that transfer be performed according to the shape of the second electrode 23. In the process view illustrated in FIG. 8, the member in which the sheet-shaped conductive die attach bonding material 34 is transferred is illustrated. It is preferable that the sheet-shaped conductive die attach bonding material 34 that is larger than the second surface of the semiconductor chip 20 be attached, and transfer be performed by heating and pressurization.

Figure 9:
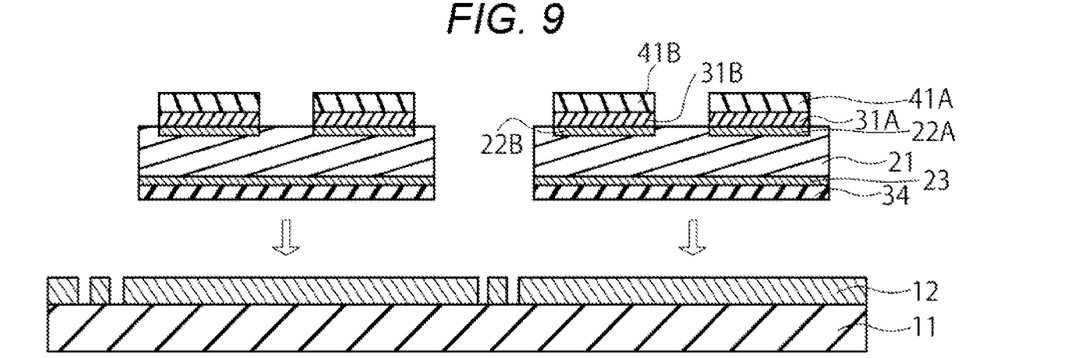
FIG. 9 is a process view of the method for manufacturing the semiconductor device of the embodiment.
Figure 10:
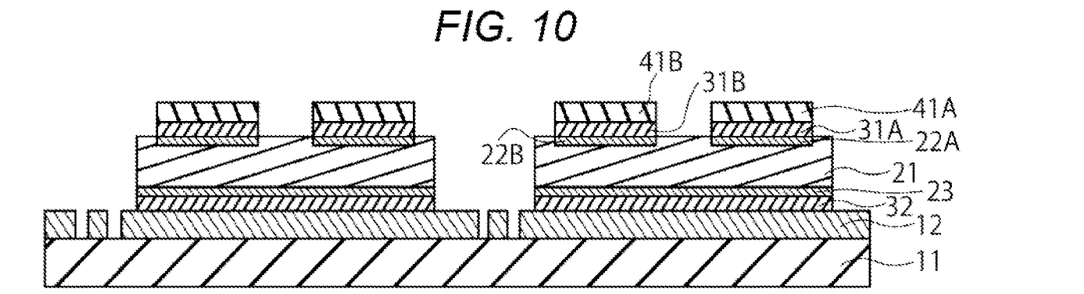
FIG. 10 is a process view of the method for manufacturing the semiconductor device of the embodiment.

In the process view of FIG. 9, the semiconductor chip 20 in which the sheet-shaped conductive die attach bonding material 34 is transferred is attached to a surface of the metal film 12 of the substrate 10. After attachment, the member illustrated in the process view of FIG. 10, in which the sheet-shaped conductive die attach bonding material 34 is sintered to bond the metal film 12 of the substrate 10 to the semiconductor chip 20 through the second conductive bonding sheet 32 is obtained. On the member of FIG. 10, the wirings 51 and 52 are formed to obtain the semiconductor device 100.

When both surfaces of the semiconductor chip 20 are bonded through the conductive bonding sheet, a wiring having high reliability and high current-carrying capacity can be formed.

Second Embodiment

Figure 11:
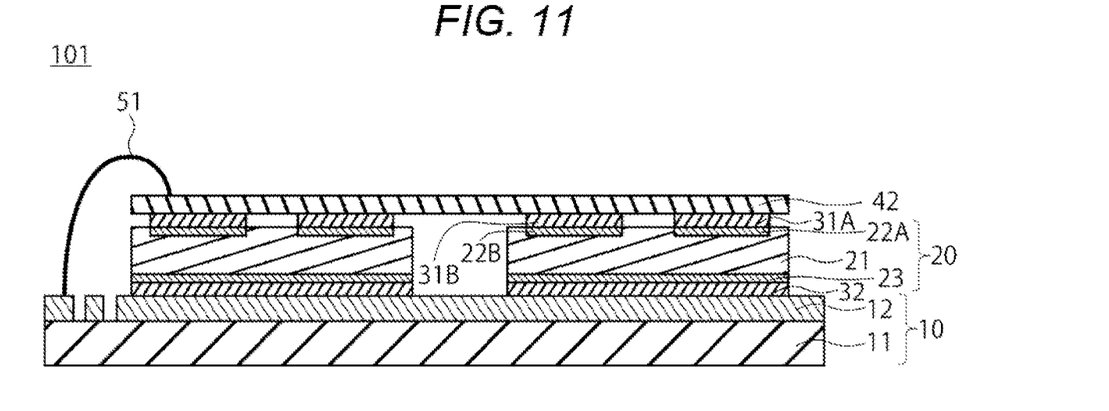
FIG. 11 is a cross-sectional view of a semiconductor device of an embodiment.

A second embodiment relates to a semiconductor device. FIG. 11 illustrates a cross-sectional view of a semiconductor device 101 of the second embodiment. The semiconductor device 101 illustrated in FIG. 11 is different from the semiconductor device 100 of the first embodiment in that a second metal plate 42 is used in place of the first metal plate 41. Description of common content among the first and second embodiments is omitted.

In the semiconductor device 101, two semiconductor chips 20 are connected through one part of the second metal plate 42. As not illustrated in the drawing, an opening for a gate wiring is provided in the second metal plate 42, and a wiring not illustrated is connected to the gate wiring.

When the semiconductor device 101 of the second embodiment is manufactured, a sheet-shaped conductive die attach bonding material can be transferred to the first electrode 22A of the semiconductor chip 20, and then bonded to the second metal plate 42. The sheet-shaped conductive die attach bonding material may be transferred to the second metal plate 42, and then bonded to the first electrode 22A of the semiconductor chip 20. In the second embodiment, two or more semiconductor chips 20 can be simultaneously attached to the second metal plate 42, and then bonded. Therefore, even when the number of chips is increased, the semiconductor device 101 can be manufactured by a reduced number of processes.

Third Embodiment

Figure 12:
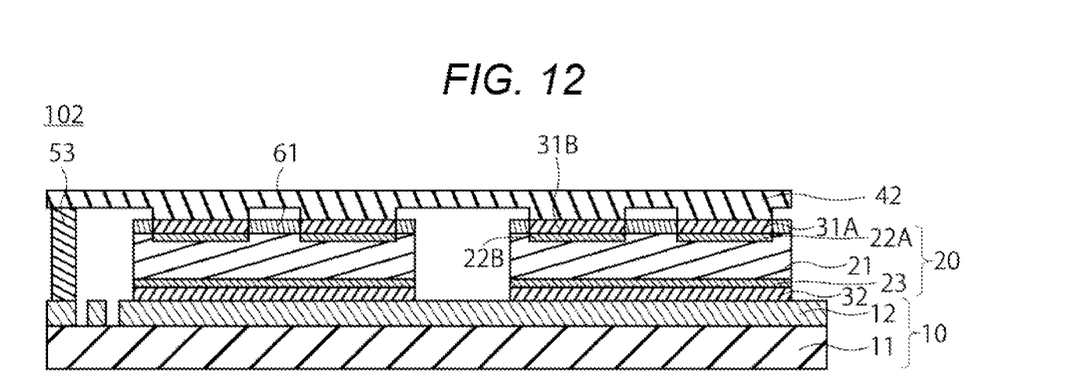
FIG. 12 is a cross-sectional view of a semiconductor device of an embodiment.

A third embodiment relates to a semiconductor device. FIG. 12 illustrates a cross-sectional view of a semiconductor device 102 of the third embodiment. The semiconductor device 102 illustrated in FIG. 12 is different from the semiconductor device 101 of the second embodiment in that as a wiring, a metal pillar 53 is used for connection of the metal film 12 of the substrate 10 to the second metal plate 42, and a convex is formed in the second metal plate 42 and the convex is connected to the semiconductor chip 20 via the first conductive sheet 31. Description of common content among the first, second, and third embodiments is omitted.

The convex can be formed in the second metal part 42. For example, this is an advantage in easy positioning. On a side face of the first conductive bonding sheet 31 and a face facing the semiconductor chip 20 of the second metal part 42, an insulating resin 61 can be provided. The insulating resin 61 can be formed after the semiconductor chip 20 is bonded to the second metal plate 42. Thus, the insulating properties and humidity resistance around the first conductive sheet 31 can be enhanced.

In the third embodiment, a wiring such as the metal pillar 53 is provided between the second metal part 42 and the metal film 12. Thus, the second metal part 42 can be connected to the metal film 12. When the metal pillar 53 is used, the current-carrying capacity of the wiring can be increased. It is preferable that the metal pillar 53 be bonded to the second metal part 42 through the conductive bonding sheet. It is preferable that the metal pillar 53 be also bonded to the metal film 12 through the conductive bonding sheet.

Fourth Embodiment

Figure 13:
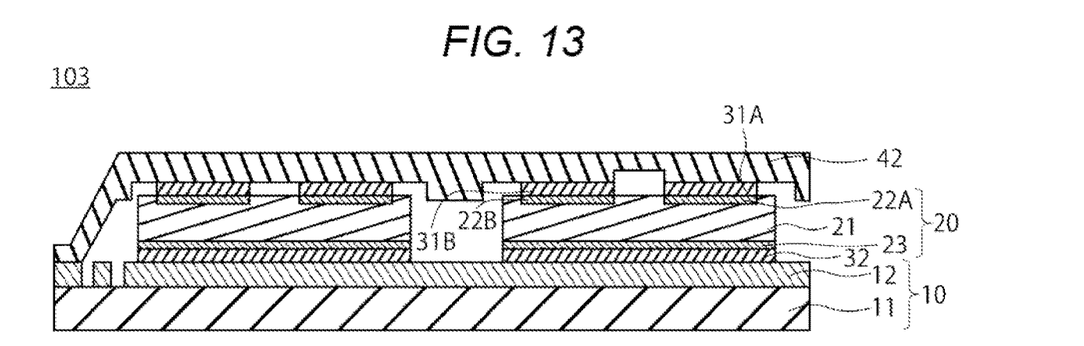
FIG. 13 is a cross-sectional view of a semiconductor device of an embodiment.

A fourth embodiment relates to a semiconductor device. FIG. 13 illustrates a cross-sectional view of a semiconductor device 103 of the fourth embodiment. The semiconductor device 103 illustrated in FIG. 13 is different from the semiconductor device 101 of the second embodiment in that the second metal plate 42 is bent and connected to the metal film 12 of the substrate 10 without a wiring, and a recess portion is formed in the second metal plate 42 and the second metal plate 42 is connected to the semiconductor chip 20 through the first conductive sheet 31 in the recess portion. Description of common content among the first to fourth embodiments is omitted.

The recess portion can be formed in the second metal part 42. For example, this is an advantage in easy positioning. In consideration of easy attachment of the semiconductor chip 20, it is preferable that the depth of the recess portion be larger than the thickness of the first conductive sheet 31. As not illustrated in the drawing, it is preferable that an insulating resin be provided on a side face of the first conductive bonding sheet 31 and a face facing the semiconductor chip 20 of the second metal part 42.

In the fourth embodiment, the second metal plate 42 is connected to the metal film 12 without a wiring. The second metal plate 42 may be bonded to the metal film 12 using the conductive bonding sheet, or directly by ultrasonic wave bonding. By ultrasonic wave bonding, the reliability of bonding is enhanced, and the reliability of the semiconductor device 103 is improved.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure. Further, although several embodiments are delineated (e.g., First Embodiment, Second Embodiment, etc.), it should be understood that while certain aspects may be mutually exclusive, others may not, and certain aspects of each embodiment may be combined to form additional embodiments.

What is claimed is:

1. A semiconductor device comprising:
   a semiconductor chip having a first electrode on a first region of a first surface of the semiconductor chip and a second electrode on a second region of the first surface of the semiconductor chip;
   a first metal plate;
   a first conductive bonding sheet disposed between the first region of the first surface of the semiconductor chip and the first metal plate, and configured to bond the first electrode to the first metal plate;
   a second metal plate;
   a second conductive bonding sheet disposed between the second region of the first surface of the semiconductor chip and the second metal plate, and configured to bond the second electrode to the second metal plate;
   a substrate having a metal film and a third conductive bonding sheet, wherein a third electrode is on a second surface of the semiconductor chip opposite the first surface, and the third electrode is bonded to the metal film through the third conductive bonding sheet;
   a second semiconductor chip having a fourth electrode on a first region of a first surface of the second semiconductor chip and a fifth electrode on a second region of the first surface of the second semiconductor chip;
   a third metal plate and a fourth metal plate;
   a fourth conductive bonding sheet disposed between the first region of the first surface of the second semiconductor chip and the third metal plate, and configured to bond the fourth electrode to the third metal plate; and
   a fifth conductive bonding sheet disposed between the second region of the first surface of the second semiconductor chip and the fourth metal plate, and configured to bond the fifth electrode to the fourth metal plate;
   wherein a sixth electrode on a second surface of the second semiconductor chip opposite the first surface of the second semiconductor chip is bonded to a second metal film of the substrate through a sixth conductive bonding sheet;
   wherein the first metal plate and the second metal plate are electrically connected by a first wiring, the second metal plate and the second metal film are electrically connected by a second wiring, and the third metal plate and the fourth metal plate are electrically connected by a third wiring.

2. The semiconductor device of claim 1, wherein the first conductive bonding sheet comprises one or more kinds of metal particles selected from a group consisting of Ag particles having a primary particle diameter of 10 nm or more and 5 μm or less, Cu particles having a primary particle diameter of 10 nm or more and 5 μm or less, and Ni particles having a primary particle diameter of 10 nm or more and 5 μm or less.

3. The semiconductor device of claim 1, wherein a maximum distance between an outer periphery of the first electrode and an outer periphery of the first conductive bonding sheet that is closest to the outer periphery of the first electrode is 0.1 mm or less.

4. The semiconductor device of claim 1, wherein an average distance between an outer periphery of the first electrode and an outer periphery of the first conductive bonding sheet that is closest to the outer periphery of the first electrode is 0.1 mm or less.

5. The semiconductor device of claim 1, wherein the first conductive bonding sheet has a surface that faces a surface of the first electrode, wherein when an outer periphery region of the first electrode overlaps with an outer periphery region of the first conductive bonding sheet, a sum of a first area of the surface of the first conductive bonding sheet that protrudes outside the outer periphery of the first electrode and a second area of the surface of the first electrode that does not overlap the first conductive bonding sheet is 5% or less of an area of the first electrode.

6. The semiconductor device of claim 1, comprising a plurality of semiconductor chips including the semiconductor chip, and the plurality of semiconductor chips are bonded to the first metal plate via the first conductive bonding sheet.

* * * * *